United States Patent [19]
Park

[11] Patent Number: 6,103,553
[45] Date of Patent: Aug. 15, 2000

[54] METHOD OF MANUFACTURING A KNOWN GOOD DIE UTILIZING A SUBSTRATE

[75] Inventor: Kyei Chan Park, Suwon, Rep. of Korea

[73] Assignee: Hyundai Electronics Industries Co., Ltd., Kyoungki-do, Rep. of Korea

[21] Appl. No.: 08/986,851

[22] Filed: Dec. 8, 1997

[30] Foreign Application Priority Data

Dec. 11, 1996 [KR] Rep. of Korea ............. 96-64251
Dec. 11, 1996 [KR] Rep. of Korea ............. 96-64252

[51] Int. Cl.⁷ ..................................... H01L 21/44
[52] U.S. Cl. ................. 438/119; 438/15; 438/613
[58] Field of Search ...................... 438/613, 118, 438/119, 15

[56] References Cited

U.S. PATENT DOCUMENTS

| | | | |
|---|---|---|---|
| 5,074,947 | 12/1991 | Estea et al. | 156/307.3 |
| 5,196,371 | 3/1993 | Kulesza et al. | 438/119 |
| 5,508,228 | 4/1996 | Nolan et al. | 438/614 |
| 5,548,884 | 8/1996 | Kim . | |
| 5,661,042 | 8/1997 | Fang et al. | 438/17 |
| 5,749,997 | 5/1998 | Tang et al. | 156/249 |
| 5,918,113 | 6/1999 | Higashi et al. | 438/119 |
| 5,940,679 | 8/1999 | Tomura et al. | 438/15 |

FOREIGN PATENT DOCUMENTS

| | | |
|---|---|---|
| 57-106062 | 7/1982 | Japan . |
| 61-253839 | 11/1986 | Japan . |
| 4-71246 | 3/1992 | Japan . |
| 5-211202 | 8/1993 | Japan . |
| 7-58173 | 3/1995 | Japan . |

OTHER PUBLICATIONS

English translation of Purpose and Constitution for JP4–71246 (Mar. 5, 1992).
English translation of Purpose and Constitution for JP5–211202 (Aug. 20, 1993).
English translation of Purpose and Constitution for JP7–58173 (Mar. 3, 1995).
English translation of Purpose and Constitution for JP61–253839 (Nov. 11, 1986).
English translation of Purpose and Constitution for JP57–106062 (Jul. 2, 1982).

*Primary Examiner*—John F. Niebling
*Assistant Examiner*—John Murphy

[57] ABSTRACT

Disclosed is a substrate used in performing a burn-in test of the integrated circuit chip prior to packaging the chip and a method for manufacturing a known good die using the same. The substrate includes a body having a plurality of through holes; a plurality of metal lines formed on one surface of the body and electrically connected to a plurality of bonding pads of the integrated circuit chip; and a plurality of pins each inserted into the respective corresponding holes and electrically connected to the respective corresponding metal lines and also projected from a surface opposite to the surface on which the metal lines of the substrate are formed. Moreover, the method of manufacturing a known good die includes performing a burn-in test in a state in which the integrated circuit chip is adhered to the substrate such that the bonding pads of integrated circuit chip are electrically connected to the metal lines of the substrate. After the performance of the burn-in test, the integrated circuit chip is separated from the substrate.

17 Claims, 4 Drawing Sheets

METHOD OF MANUFACTURING A KNOWN GOOD DIE UTILIZING A SUBSTRATE

BACKGROUND OF THE INVENTION

The invention relates to a semiconductor device, and more particularly to a substrate for performing a burn-in test of integrated circuit chips (IC chips) and a method of manufacturing a good die array utilizing the substrate.

Standard integrated circuit chips, in general, are subjected to various tests in order to determine the reliability of the chips before distributing the chips for use. Briefly, there are two important reliability tests: one is an electrical characteristic test in which all input and output terminals are connected to a test signal generator to verify the transferring characteristics between the signals coming in and out at the terminals; the other is a burn-in test in which a given chip is exposed to overstress conditions of higher than normal operating temperatures and voltages to verify its lifetime and to detect defects.

As an example, the burn-in test for a dynamic random access memory chip has appreciated as a useful method to verify the reliability of memory circuit elements such as memory cells and signal lines. During the burn-in test, defects latent in a dynamic random access memory chip result in the destruction of gate oxide films of MOS transistors and shortening between multi-leveled conduction layers. These defective chips are abandoned as inferior and non-defective chips are selected as a known good die instead.

In such a burn-in test, the defective chips abandoned as inferior are about 5% to 10% of the tested chips. Therefore, since the defective chips are already packaged, the conventional technologies for fabricating the known good die require the use of many materials and the unwanted investment of unnecessary cost.

SUMMARY OF THE INVENTION

Accordingly, it is an object of the invention to provide a substrate for a burn-in test of the integrated circuit chip in a state of non-packaged chip, which obviates the use of unnecessary materials and the investment of unnecessary cost in manufacturing the known good die.

It is another object of the invention to provide a method for producing the known good die, which eliminates the use of unnecessary materials and the invenstment of unnecessary cost.

To achieve the above objectives of this invention, there is provided a substrate for burn-in test of an integrated circuit chip with a plurality of bonding pads so as to verify whether the chip is a known good die. The substrate includes a body having a plurality of through holes; a plurality of metal lines electrically connected to the bonding pads of the integrated circuit chip and formed on one surface of the body; a plurality of pins each inserted into the respective corresponding holes and thus electrically connected to the respective corresponding metal lines and also projected from a surface opposite to the surface on which the metal lines are formed, the pins being electrically connected to an exterior electrical circuit.

To achieve another object of this invention, there is provided one method for manufacturing a known good die including the steps of: providing a substrate including a body, a plurality of metal lines formed on one surface of the body and a plurality of conductive pins which project from the other surface of the body and electrically connect with the metal lines; forming an adhesive film having a higher melting point than that of an normal operating temperature of the die, on the surface on which the metal lines of the body are formed; adhering an integrated circuit chip having a plurality of bonding pads thereon and a plurality of bumps formed on the bonding pads, onto the surface of the body through the adhesive film such that the bumps are aligned with the metal lines of the substrate; carrying out a burn-in test of the integrated circuit chip, and separating the chip from the substrate by vaporizing the adhesive films.

There is also another method for manufacturing a known good die including the steps of: providing a substrate including a body, a plurality of metal lines formed on one surface of the body and a plurality of conductive pins which project from the other surface of the body and electrically connect with the metal lines; adhering an integrated circuit chip having a plurality of bonding pads, a plurality of conductive elements bonded on the bonding pads, and a plurality of solder-containing metals having a melting point higher than a normal operating temperature of the known-good die and attached to the conductive elements, onto the surface on which the metal lines of the body are formed, thereby to connect the bonding pads to the metal lines of the substrate; carrying out a burn-in test of the chip; and separating the chip from the substrate by melting the solder-containing metals.

The forgoing and other objects, features and features and advantages of the invention will be apparent from the following and more particular description of the preferred embodiments of the invention, as illustrated in the accompanied drawings.

DETAILED DESCRIPTION OF PREFFERED EMBODIMENTS

Figure 1A:
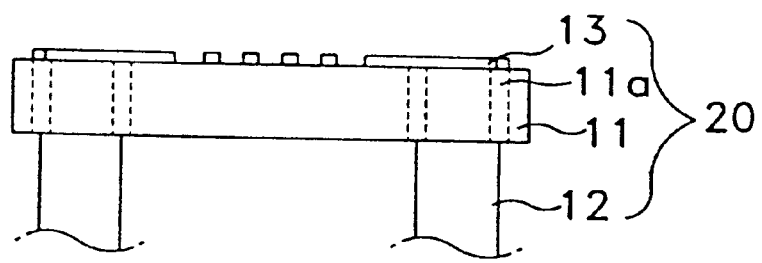
FIG. 1A is a side view of a substrate for carrying out a burn-in test of the integrated circuit chip according to the preferred embodiment of this invention.
Figure 1B:
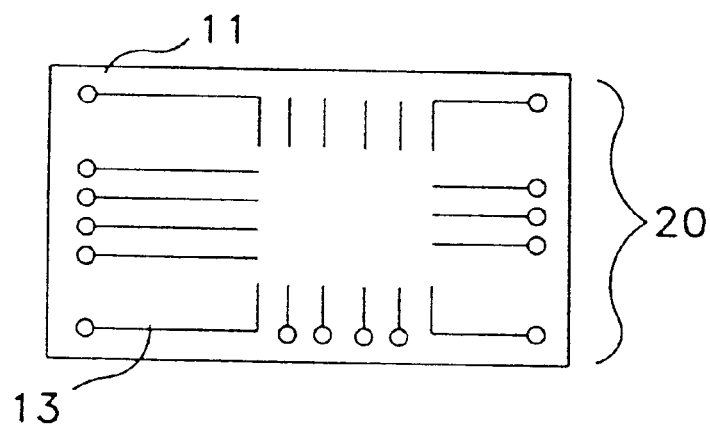
FIG. 1B is a top view of the substrate of FIG. 1A including a plurality of metal lines attached on the body of the substrate.

FIGS. 1A and 1B show a substrate for carrying out a burn-in test of the integrated circuit chip according to the preferred embodiment of this invention. Referring to FIGS. 1A and 1B, the substrate 20 includes a body 11 having a plurality of through holes 11a formed therein. The body 11 is, preferably, made of ceramic material or organic material such as polyimide. Each of the through holes 11a, preferably, has a diameter of about 2540 $\mu$m to 3810 $\mu$m. On a top surface of the body 11 are formed a plurality of metal lines 13 to be electrically connected to the bonding pads of the integrated circuit chip, as described in the following. The metal lines 13 are made of at least one metal selected from the group consisting of copper, nickel and gold. In the case in which the metal lines are made of copper, the thickness of each of the metal lines is about ⅛ oz to 1 oz (wherein 1 oz is 3 5 µm.), and preferably is about 35 µm. In the case of gold, the thickness is about 0.2 µm to 3.75 µm and is preferably about 2.5 µm to 3.0 µm. In the case of nickel, the thickness is about 0.5 µm to 6.0 µm and is preferably about 3.0 µm to 5.08 µm. Moreover, a plurality of pins 12 for making electrical connection with an exterior electrical terminals are projected from the surface of the body opposite to the surface on which the metal lines 13 are formed. Here, the pins are inserted to the through holes 11a formed on the body 11, thereby to be electrically connected to the metal lines 13, respectively.

Now, a method for manufacturing a known good die using the substrate 20 shown in FIGS. 1A and 1B will be described.

Figure 2:
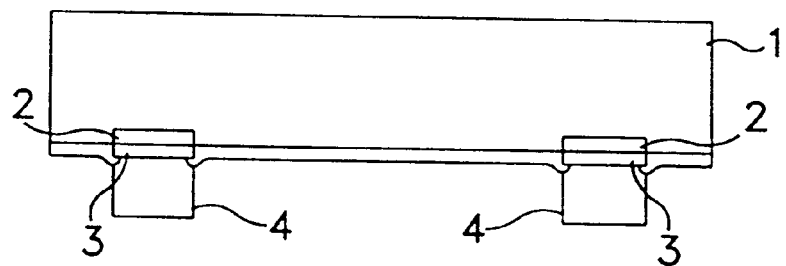
FIG. 2 is a side view of the integrated circuit chip used in the first embodiment of the method of manufacturing the known good die according to this invention.

FIG. 2 is a side view of the integrated circuit chip used in the first embodiment of the method of manufacturing the known good die according to this invention. Referring to FIG. 2, an integrated circuit chip 1 is referred to as a bare chip which is not packaged. The chip 1 has a plurality of bonding pads 2 formed on one surface thereof, for making electrical connection with an exterior electrical elements. On the surface of the chip 1 including the bonding pads 2 are plated conductive under bump metals 3 in accordance with a prior art method. Furthermore, on the under bumper metals 3 are formed bumps 4 in a prior art method for manufacturing the bumpers. The integrated circuit chip with bumps formed in such manner is adhered to the body 11 of substrate 20 shown in FIGS. 1A and 1B so as to carry out the burn-in test.

Figure 3:
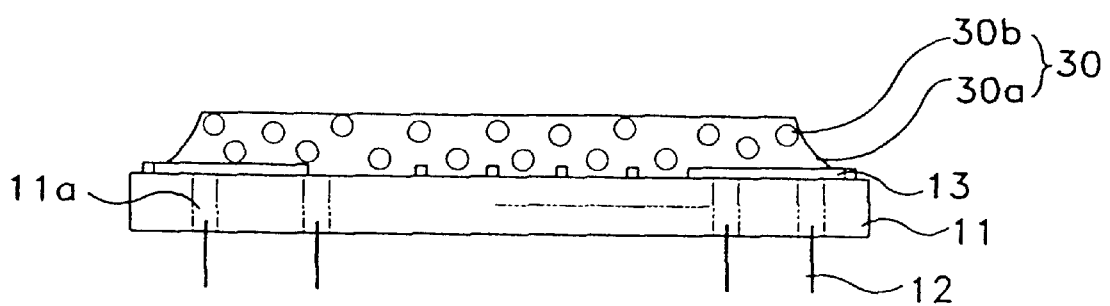
FIG. 3 is a side view showing a resin laminate containing conductive particles formed on the substrate of FIG. 1A.

So as to adhere the chip to the substrate, first, as shown in FIG. 3, on the surface of the body 11 on which metal lines 13 are formed, is formed an adhesive and conductive film 30 made of an adhesive resin 30a, containing a conductive metal particles 30b. The adhesive and conductive film 30 is preferably an anisotropic conductive film. Here, the anisotropic conductive film is made of a resin containing an electrical conductive metal. The forming step of the adhesive and conductive film 30 is carried out under the pressure of about 5 kg and at a temperature of about 80° C. during about 5 sec. The adhesive and conductive film 30 has a glass transition temperature or a melting temperature higher than a normal operating temperature of the integrated circuit chip so that the adhesive conductive film 30 is not melted during the burn-in test which is performed at the temperature higher than the normal operating temperature of the integrated circuit chip. It is preferable that the adhesive conductive film 30 has a melting temperature of about 150° C.

Figure 4:
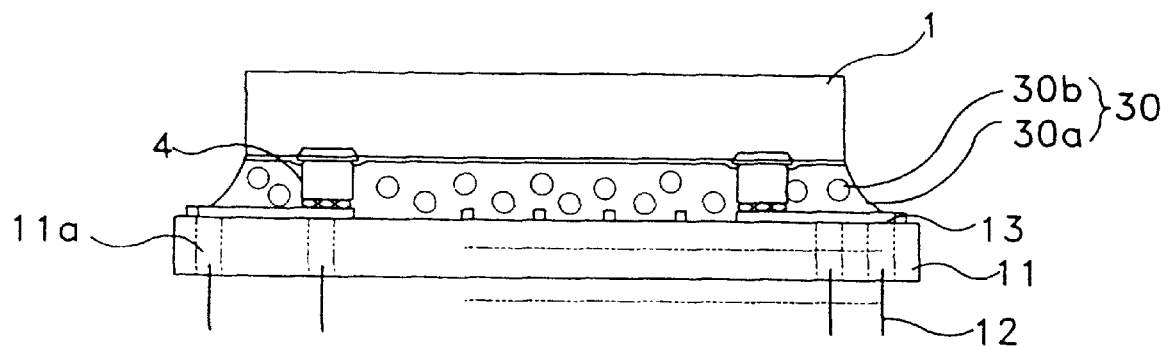
FIG. 4 is a side view showing a substrate of FIG. 3 on which the integrated circuit chip is attached.

After the formation of the adhesive conductive film, as shown in FIG. 4, the integrated circuit chip 1 is attached onto the body 11 of the substrate 20. The attachment of the integrated circuit chip 1 is accomplished by the following processes. First, in the aligned state in which the bumps 4 face the adhesive conductive film 30, the integrated circuit chip 1 is put on the body 11 of the substrate 20. The chip is then pressurized downwardly at a glass transition temperature of the adhesive conductive film 30, in general, at the temperature of about 150° C. or less. At the temperature and the pressure of the above described, the bumps 3 of the chip 1 is electrically connected to the metal lines 13 through the conductive particles 30b contained in the adhesive conductive film 30. After the attachment of the integrated circuit chip 1 to the body 11 of the substrate 20, the burn-in test to verify whether the chip 1 has the defects or not is carried out. The burn-in test is performed in a normal manner. Though not described in detail, any person in the prior art may understand that the substrate 20 is attached to a normal burn-in testing apparatus, for example a burn-in board having used for a pin grid array via the pins 12, thereby to be electrically connected to the burn-in board and that test signals are applied to the integrated circuit chip 1 during a selected period several times at a temperature higher than the normal operating temperature. For example, the test signal are supplied to the integrated circuit chip 1 three times, i.e., during 48 hours, 38 hours, and 38 hours at a temperature of about 125° C. As a result of the burn-in test, the integrated circuit chip which has no defects is classified as the known good die and the integrated circuit chip which has defects is abandoned as the inferior chip.

After the burn-in test, the integrated circuit chip 1 is separated from the substrate 20. To separate the integrated circuit chip 1 from the substrate 20, the substrate 20 to which the integrated circuit chip 1 is attached is hold in an atmosphere of an inert gas at the temperature higher than the glass transition temperature. For example, the substrate 20 attached to the integrated circuit chip 1 is hold during about 10 seconds at the thermal atmosphere of N2 gas at a temperature of about 170° C. to 200° C., preferably at a temperature of about 200° C. Thus, the adhesive conductive film 30 is vaporized completely after about 3 seconds to 4 seconds and the integrated circuit chip 1 is thus separated from the substrate 20. Alternatively, so as to separate the integrated circuit chip 1 from the substrate 20, the method for vaporizing the adhesive film 30 by transferring the heat from the back surface of the integrated circuit chip 1 to the adhesive film 30 using hot bars of about 200° C., may be used. The chip which is classified as the known good die and is separated from the substrate is sold using waffle-pack as a carrier or is used as a multi-chip module, a direct chip attach, a flip-flop, or a chip on board, etc.

Figure 5:
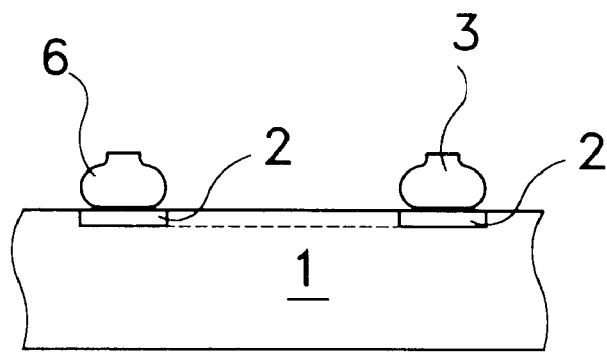
FIG. 5 is a side view of an integrated circuit chip used in a second embodiment of the method of manufacturing the known good die according to this invention.
Figure 6:
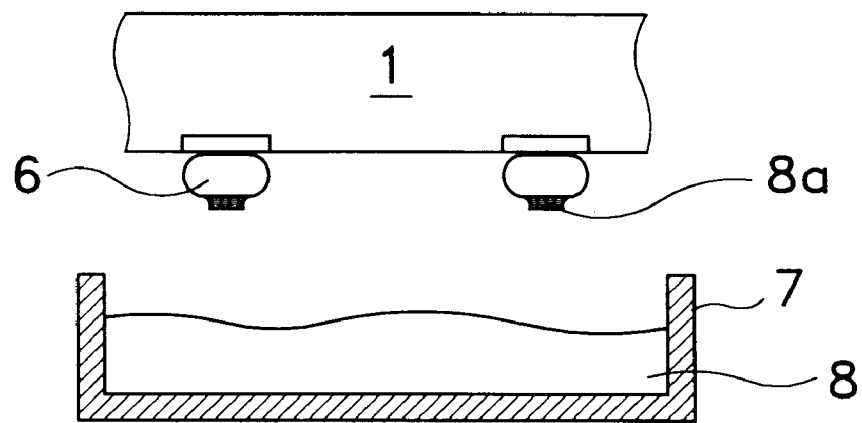
FIG. 6 is a view for explaining a method of forming the solder-containing metals on the chip FIG. 5.
Figure 7:
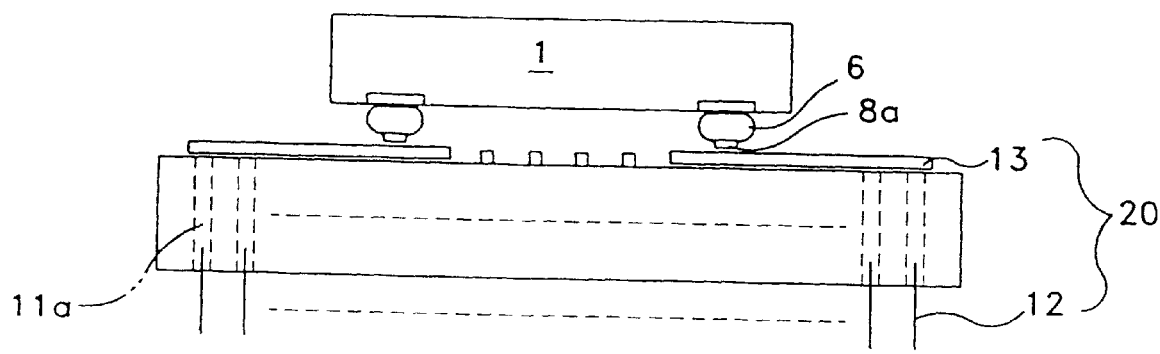
FIG. 7 is a side view showing the substrate of FIG. 1A having the chip of FIG. 6 adhered thereto.

FIGS. 5 to 7 show a second embodiment regarding the method for manufacturing a known good die according to this invention. In FIGS. 5 to 7, the same numerals are referred regarding to the same elements as described in the drawings relating to the above first embodiment.

In the second embodiment, so as to carry out the burn-in test of the integrated circuit chip, the substrate 20 shown in FIGS. 1A and 1B is used as described in the first embodiment. However, in the second embodiment, the attachment of the integrated circuit chip to the substrate 20 is carried out in a different manner from in the first embodiment. Referring to FIG. 5 showing the integrated circuit chip to be used in the second embodiment, wires(not shown) are bonded to bonding pads 2 formed on an integrated circuit chip 1. The wires have at least one composition selected from the group consisting of Au, Pb+Sn, Cu, Au+Pb+Sn, Au+Sn, and Cu+Pb+Sn according to a conventional wire bonding method. Bonded wires are cut at the neck portions of the conductive balls 6 and have thus the balls 6 having the height of about 20 µm to 100 µm and the size of about 50 µm to 100 µm.

On the cut portion of the balls 6 are attached solder-containing metals 8a. FIG. 6 shows the state in which the solder-containing metals are attached on the conductive balls 6. Referring to FIG. 6, a small amount of solder-containing metals 8a is adhered on the end surface of the balls 6 bonded to the integrated circuit chip 1 by simply dipping the surface of balls 6 into the liquid state solder-containing metals 8 put in the box 7. The solder-containing metals, preferably, have the composition of 62Sn/34Pb/2Ag, 62Sn/34Pb/2In, or 63Sn/37Pb.

After adhering the solder-containing metals 6a by dipping, the integrated circuit chip 1 is aligned such that the adhered solder-containing metals 6a, respectively face the metal lines 13 of the substrate 20 and the integrated circuit chip 1, as shown in FIG. 7, is put on the substrate 20. Next, the integrated circuit chip 1 is mounted on the substrate 20 by the solder containing metals 8a by pressuring the integrated circuit chip 1 downward in a load of 1 kgf or less, at a temperature of about 170° C. to 185° C. which corresponds to the temperature higher than the melting temperature of the solder-containing metals 8a and also higher than the temperature at which the burn-in test is carried out.

After the mounting of the integrated circuit chip 1 on the substrate 20, a burn-in test is carried out in the similar manner to in the first embodiment of this invention. Following the burn-in test, the integrated circuit chip 1 is separated from the substrate 20. In order to separate the chip 1 from the substrate 20, the substrate 20 having the integrated circuit chip 1 is exposed during a selected period in the thermal atmosphere of an inert gas at a temperature higher than the melting point of the solder-containing metals 8a. For example, the substrate 20 is exposed during about 10 seconds in an atmosphere of N2 gas at a temperature of about 180° C. to about 200° C., preferably at a temperature of about 200° C. As a result, the solder-containing metals 8a is completely melted after about 3 seconds to 4 seconds and the integrated circuit chip is thus separated from the substrate 20. Alternatively, so as to separate the integrated circuit chip 1 from the substrate 20, the method for melting the solder-containing metals 8a by transferring the heat from the back surface of the integrated circuit chip 1 to the adhesive film 30 using hot bars of about 200° C., may be used.

The chip which is classified as the known good die and is separated from the substrate, according to the second embodiment of this invention, is sold using waffle-pack as a carrier or is used as multi-chip module, a direct chip attach, a flip-chip, or chip on board, etc.

As described above, according to this invention, without the need of the package of the integrated circuit chip, a bare chip may be used for a burn-in test. Therefore, since there is not a need to package the integrated circuit chip which is verified as defective integrated circuit chip, the material consumed in the package of the defective integrated circuit chip is saved and the process cost is greatly reduced. This incurs the reduced manufacturing cost of the known good die. Moreover, since the substrate according to this invention is simple in the structure and can be used in the combination of the conventional burn-in testing apparatus, there is an additional benefit that this invention can be exactly embodied.

Having described preferred embodiments of this invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method of manufacturing a known good die comprising the steps of:

providing a substrate having a plurality of metal lines formed on one surface thereof and having a plurality of conductive pins which are projected from an opposite surface of the substrate and which are electrically connected to the metal lines;

forming an adhesive film, having a melting point of about 150° C., on the surface on which the metal lines are formed;

adhering an integrated circuit chip having a plurality of bonding pads and a plurality of bumps each formed on the respective corresponding bonding pads, on the substrate through the adhesive film such that the bumps each are aligned to the respective corresponding metal lines;

carrying out a burn-in test of the integrated circuit chip;

separating the integrated circuit chip from the substrate by vaporizing the adhesive film positioning the integrated circuit chip on the adhesive film in a state that the bumps of the integrated circuit chip face the metal lines of the substrate and are aligned with the metal lines of the substrate; and pressurizing the integrated circuit chip downward at a glass transition temperature of the adhesive film or less.

2. The method according to claim 1, wherein the adhesive film is an anisotropic conductive film.

3. The method according to claim 1, wherein the separating step of the integrated circuit chip from the substrate is performed by exposing the substrate having the chip to an atmosphere of a non active gas at a temperature higher than a glass transition temperature of the adhesive film.

4. The method according to claim 1, wherein the separating step of the integrated circuit chip from the substrate is performed by transferring a heat from the back face of the chip attached to the substrate to the adhesive film using a hot bar having a temperature higher than a glass transition temperature of the adhesive film.

5. The method according to claim 3, wherein the inert gas is a nitrogen gas having a temperature of about 170° C. to 200° C.

6. The method according to claim 4, wherein the hot bar has a temperature of about 190° C. to 210° C.

7. A method of manufacturing a known good die comprising the steps of:

providing a substrate having a plurality of metal lines formed on one surface thereof and having a plurality of conductive pins which are projected from an opposite surface of the substrate and which are electrically connected to the metal lines;

bonding an integrated circuit chip having a plurality of bonding pads, a plurality of conductive elements formed on the bonding pads and a plurality of solder-containing metals formed on the conductive elements and having a temperature of about 150° C. on the surface onto which the metal lines are formed, such that the bonding pads are electrically connected to the metal lines of the substrate;

carrying out a burn-in test of the integrated circuit chip;

separating the integrated circuit chip from the substrate by melting the solder-containing metals positioning the integrated circuit chip on the substrate in a state that the solder-containing metals face the corresponding metal lines of the substrate and each is aligned with the respective corresponding metal lines of the substrate; and pressurizing the integrated circuit chin downward at a melting point of the solder containing metals or less.

8. The method according to claim 7, wherein the conductive elements are made of one selected from the group consisting of Au, Pb+Sn, Cu, Au+Pb+Sn, Au+Sn, and Cu+Pb+Sn.

9. The method according to claim 7, wherein the conductive elements each has a ball shape.

10. The method according to claim 9, wherein the conductive elements each having a ball shape have a height of about 20 µm to 100 µm.

11. The method according to claim 9, wherein the conductive elements each having a ball shape have a diameter of about 50 µm to 100 µm.

12. The method according to claim 7, wherein the solder containing metals each has a composition selected from the group consisting of 62 wt. % Sn/34 wt. % Pb/2 wt. % Ag, 62 wt. % Sn/34 wt. Pb/2 wt. % In, and 63 wt. %/37 wt.% Pb.

13. The method according to claim 7, wherein the solder containing metals each has a melting point of about 170° C. to 185° C.

14. The method according to claim 7, wherein the separating step of the integrated circuit chip from the substrate is performed by exposing the substrate having the chip to an atmosphere of an inert gas at a temperature higher than a melting point of the solder containing metals.

15. The method according to claim 7, wherein the separating step of the integrated circuit chip from the substrate is performed by transferring a heat from the back face of the chip attached to the substrate to the solder containing metals using a hot bar having a temperature higher than a melting point of the solder containing metals.

16. The method according to claim 14, wherein the inert gas is a nitrogen gas having a temperature of about 170° C. to 200° C.

17. The method according to claim 15, wherein the hot bar has a temperature of about 190° C. to 210° C.

* * * * *

UNITED STATES PATENT AND TRADEMARK OFFICE
CERTIFICATE OF CORRECTION

PATENT NO : 6,103,553
DATED : August 15, 2000
INVENTOR(S) : Kyei Chan Park

It is certified that error appears in the above-identified patent and that said Letters Patent are hereby corrected as shown below:

At column 6, line 62, delete "chin" and substitute --chip--.

Signed and Sealed this

Twenty-fourth Day of April, 2001

Attest:

NICHOLAS P. GODICI

Attesting Officer

Acting Director of the United States Patent and Trademark Office